US008627117B2

(12) United States Patent
Johnston

(10) Patent No.: US 8,627,117 B2
(45) Date of Patent: Jan. 7, 2014

(54) DEVICE WITH POWER CONTROL FEATURE INVOLVING BACKUP POWER RESERVOIR CIRCUIT

(75) Inventor: Darren Edward Johnston, Burnsville, MN (US)

(73) Assignee: Seagate Technology LLC, Cupertino, CA (US)

( * ) Notice: Subject to any disclaimer, the term of this patent is extended or adjusted under 35 U.S.C. 154(b) by 753 days.

(21) Appl. No.: 12/632,566

(22) Filed: Dec. 7, 2009

(65) Prior Publication Data
US 2010/0332863 A1 Dec. 30, 2010

Related U.S. Application Data

(60) Provisional application No. 61/220,924, filed on Jun. 26, 2009.

(51) Int. Cl.
G06F 1/00 (2006.01)
G06F 13/00 (2006.01)

(52) U.S. Cl.
USPC ............ 713/300; 711/103; 711/113; 713/340

(58) Field of Classification Search
USPC .......... 713/300, 340, 324, 310, 320; 365/228, 365/229; 604/151; 348/372; 323/288, 277; 307/39; 711/103, 113
See application file for complete search history.

(56) References Cited

U.S. PATENT DOCUMENTS

| 4,510,400 | A | 4/1985 | Kiteley |
| 5,367,489 | A | 11/1994 | Park et al. |
| 5,459,850 | A | 10/1995 | Clay et al. |
| 5,483,486 | A | 1/1996 | Javanifard et al. |
| 5,497,119 | A | 3/1996 | Tedrow et al. |
| 5,537,360 | A | 7/1996 | Jones et al. |
| 5,546,042 | A | 8/1996 | Tedrow et al. |
| 5,567,993 | A | 10/1996 | Jones et al. |
| 5,592,420 | A | 1/1997 | Cernea et al. |
| 5,914,542 | A | 6/1999 | Weimer et al. |
| 5,959,926 | A | 9/1999 | Jones et al. |
| 6,091,617 | A | 7/2000 | Moran |
| 6,404,647 | B1 | 6/2002 | Minne' |
| 6,567,261 | B2 | 5/2003 | Kanouda et al. |
| 6,700,352 | B1 | 3/2004 | Elliott et al. |
| 6,788,027 | B2 | 9/2004 | Malik |
| 6,838,923 | B2 | 1/2005 | Pearson |
| 6,981,161 | B2 | 12/2005 | Koo |
| 7,019,583 | B2 | 3/2006 | Del Signore, II et al. |

(Continued)

OTHER PUBLICATIONS

N. Li, J. Zhang, and Y. Zhong, "A Novel Charging Control Scheme for Super Capacitor Energy Storage in Photovoltaic Generation System," DRPT2008 Apr. 6-9, 2008 Nanjing China.

(Continued)

Primary Examiner — Thomas Lee
Assistant Examiner — Aurel Prifti
(74) Attorney, Agent, or Firm — Crawford Maunu PLLC

(57) ABSTRACT

Power-backup capabilities are provided by implementing a variety of different methods, systems and devices. According to one such implementation, an energy storage device such as a capacitive storage circuit is powered relative to the powering of one or more additional circuits from a common power supply to limit the draw upon the power supply. Certain applications involve delaying or otherwise modifying the powering of the capacitive storage circuit, which may involve an initial startup of the capacitive storage circuit.

22 Claims, 4 Drawing Sheets

(56) References Cited

U.S. PATENT DOCUMENTS

| | | | |
|---|---|---|---|
| 7,173,821 B2 | 2/2007 | Coglitore | |
| 7,177,222 B2 | 2/2007 | Spengler | |
| 7,233,890 B2 | 6/2007 | Shapiro et al. | |
| 7,254,723 B1 * | 8/2007 | Favey et al. | 713/300 |
| 7,268,998 B2 | 9/2007 | Ewing et al. | |
| 7,269,755 B2 * | 9/2007 | Moshayedi et al. | 714/2 |
| 7,305,572 B1 * | 12/2007 | Burroughs et al. | 713/300 |
| 7,310,707 B2 | 12/2007 | Olds et al. | |
| 7,318,121 B2 | 1/2008 | Gaertner et al. | |
| 7,321,521 B2 | 1/2008 | Spengler | |
| 7,334,144 B1 | 2/2008 | Schlumberger | |
| 7,404,073 B2 | 7/2008 | Felts | |
| 7,404,131 B2 | 7/2008 | McCarthy et al. | |
| 7,414,335 B2 | 8/2008 | Hussein et al. | |
| 7,487,391 B2 | 2/2009 | Pecone et al. | |
| 7,661,002 B2 * | 2/2010 | Pecone et al. | 713/300 |
| 7,808,548 B1 * | 10/2010 | Popescu-Stanseti et al. | 348/372 |
| 8,009,502 B2 * | 8/2011 | Johnston et al. | 365/229 |
| 8,031,551 B2 * | 10/2011 | Wilson | 365/228 |
| 2002/0030474 A1 * | 3/2002 | Sakiyama et al. | 323/288 |
| 2006/0080515 A1 | 4/2006 | Spiers et al. | |
| 2007/0186120 A1 * | 8/2007 | Yasuo et al. | 713/300 |
| 2007/0223870 A1 | 9/2007 | Farling et al. | |
| 2008/0007219 A1 | 1/2008 | Williams | |
| 2008/0178029 A1 * | 7/2008 | McGrane et al. | 713/324 |
| 2008/0215808 A1 * | 9/2008 | Ashmore et al. | 711/113 |
| 2008/0232144 A1 | 9/2008 | Klein | |
| 2009/0006877 A1 | 1/2009 | Lubbers et al. | |
| 2009/0113221 A1 * | 4/2009 | Holle et al. | 713/310 |
| 2009/0121548 A1 * | 5/2009 | Schindler et al. | 307/39 |
| 2009/0218997 A1 * | 9/2009 | Hey et al. | 323/273 |
| 2009/0300374 A1 * | 12/2009 | Mori | 713/300 |
| 2010/0049905 A1 * | 2/2010 | Ouchi | 711/103 |
| 2010/0094221 A1 * | 4/2010 | Spencer et al. | 604/151 |
| 2010/0115304 A1 * | 5/2010 | Finkelstein et al. | 713/320 |
| 2010/0162024 A1 * | 6/2010 | Kuris et al. | 713/340 |
| 2010/0329064 A1 * | 12/2010 | Wilson | 365/229 |

OTHER PUBLICATIONS

ECNmag.com, "1.2A, 1.6MHz Synchronous Boost Regulator from Linear Technology," Top News, Jan. 8, 2009.

Intel® Mainstream Sata Solid State Drives, "Intel® X25-M and X18-M Mainstream SATA Solid-State Drives".

"Get the Lowdown on Ultracapacitors," Penton Media, Inc., Nov. 15, 2007.

STMicroelectronics, "Regulating Pulse Width Modulators, SG3524," Jul. 2000.

Linear Technology, "1.2A Synchronous Step-up DC/DC Converter with Input Current Limit, LTC3125," 2008.

* cited by examiner

DEVICE WITH POWER CONTROL FEATURE INVOLVING BACKUP POWER RESERVOIR CIRCUIT

RELATED PATENT DOCUMENTS

This patent document claims the benefit under 35 U.S.C. §119(e) of U.S. Provisional Patent Application No. 61/220,924 filed on Jun. 26, 2009, and which is fully incorporated herein by reference.

FIELD OF THE INVENTION

Aspects of the present invention relate to monitoring features that can be particularly useful for memory applications in which power draw is an important issue.

BACKGROUND

Computer systems generally have several levels of memory; each level of memory can provide differing levels of speed, memory capacity, physical size, power requirements, voltage levels and/or volatility. These aspects are often at odds with each other. For example, increases in speed often lead to corresponding increases in power requirements. For this reason, many systems use a variety of different memories within the same system. From the view of the processor these memories are often hidden in the sense that common data is temporarily cached in smaller and faster memory circuits. This common data is mapped to larger and slower memory circuits, which are accessed when the faster memory does not contain the desired data. The common data, if changed in the cached memory, can eventually be written to the larger and slower memory circuits. This allows for the slow memory access time to be hidden so long as the faster memory contains the appropriately mapped data.

Computer systems generally contain some type of mass-storage memory that is able to store data when the computer system is powered down or when the memory otherwise loses power. This type of memory is referred to as nonvolatile memory because it is able to maintain data integrity when the computer system is not powered. Nonvolatile memory, however, can be slower by orders of magnitude relative to various volatile memories. Yet, nonvolatile can also be less expensive (per unit of memory capacity) and/or less power hungry. A common type of nonvolatile mass-storage memory device is a hard disc drive (HDD) that uses a rotating magnetic media. HDDs are used for home-computers, servers, enterprise applications and various other devices. Under normal operation a computer system transfers sensitive data from temporary memory to a HDD before the computer system is powered down. This allows for the sensitive data to be saved in memory that persists after the power is removed from the computer system. When the computer system is subsequently powered up, this data can be accessed and used by the computer system.

HDDs with rotating magnetic media have been in use for many years and have undergone various improvements including efficiency, reliability and memory capacity. Various data storage applications, however, are beginning to use other types of memory with more frequency. Solid State Devices (SSDs) are one such type of memory, and are attractive for many applications. Speed, cost and power requirements also factor into the selection of data storage devices such as SSDs or HDDs.

In addition to the above, power consumption is an important factor in most data storage systems, and effectively managing power consumption at startup can be particularly difficult. Generally, capacitive circuits draw a significant amount of power upon turn-on, as do motors used to drive HDD spindles. This can present challenges such as those relating to one or more of cost, power supply lifetime, etcetera.

While SSDs are useful in various applications, aspects of their operation and implementation remain challenging. For example, the above-discussed power consumption issues can be challenging to the implementation of capacitive-type SSD circuits, HDD drives, and to combinations of such drives. Power consumption issues are further exasperated when many of these drives draw power from a common power source. Providing power in an efficient, reliable and inexpensive manner has been challenging.

SUMMARY

The present invention is directed to systems and methods for use with power control features of data storage applications in which data integrity is an issue. These and other aspects of the present invention are exemplified in a number of illustrated implementations and applications, some of which are shown in the figures and characterized in the claims section that follows.

Consistent with one embodiment of the present invention a data storage device stores data in response to data accessed under the control of a memory control circuit. The data storage device includes a primary memory circuit, a solid-state caching memory circuit, a backup power-reservoir circuit and a power supply control circuit. The primary memory circuit maintains data integrity in the absence of operating power, and the solid-state caching memory circuit is mapped to the primary memory circuit and provides the memory control circuit with access to a set of data representing a cached portion of memory that is mapped to the primary memory circuit. The caching memory circuit also includes a controller configured to control backup functions of the caching memory circuit in response to a power interruption. The backup power-reservoir circuit includes a capacitor coupled to receive a charge from a power supply, and holds a charge to supply backup power for powering backup functions of the caching memory circuit. The power supply control circuit controls, in response to a determined type and number of memory circuits in the data storage device, offset charging of the backup power-reservoir circuit relative to the powering of another memory circuit to limit the current load upon the power supply according to a threshold current.

Another example embodiment is directed to a data storage device that stores data in response to data accesses under the control of a memory control circuit, with algorithm-based power supply control. The data storage device includes a power supply, a primary memory circuit, a solid-state caching memory circuit mapped to the primary memory circuit, and a backup power-reservoir circuit. The primary memory circuit maintains data integrity in the absence of operating power. The solid-state caching memory circuit provides the memory control circuit with access to a set of data representing a cached portion of memory that is mapped to the primary memory circuit, and includes a controller that controls backup functions of the caching memory circuit in response to a power interruption. The backup power-reservoir circuit includes a capacitor coupled to receive a charge from the power supply, and that holds a charge to supply backup power for powering backup functions of the caching memory circuit. The power supply control circuit selects, in response to a number and type of memory circuits in the data storage device, a power startup algorithm from a set of algorithms respectively for starting a combination of memory circuits including the backup power-reservoir circuit and at least another memory circuit, where at least one of the algorithms is for starting up a memory circuit of a different type than the backup power-reservoir circuit. The selected algorithm is executed to control offset charging of the backup power-reservoir circuit relative to the powering of another memory circuit to limit the current load upon the power supply according to a threshold current.

Various other embodiments are directed to methods relating to the above, combinations of the above circuits and functions, and variations upon the same, as may be relevant to one or more of controlling startup power, controlling operating power after startup, and controlling the startup of additional circuits during post-system startup operation.

The above summary is not intended to describe each illustrated embodiment or every implementation of the present invention. The figures and detailed description that follow, including that described in the appended claims, more particularly exemplify these embodiments.

BRIEF DESCRIPTION OF THE DRAWINGS

The invention may be more completely understood in consideration of the detailed description of various embodiments of the invention that follows in connection with the accompanying drawings as follows.

Figure 1:
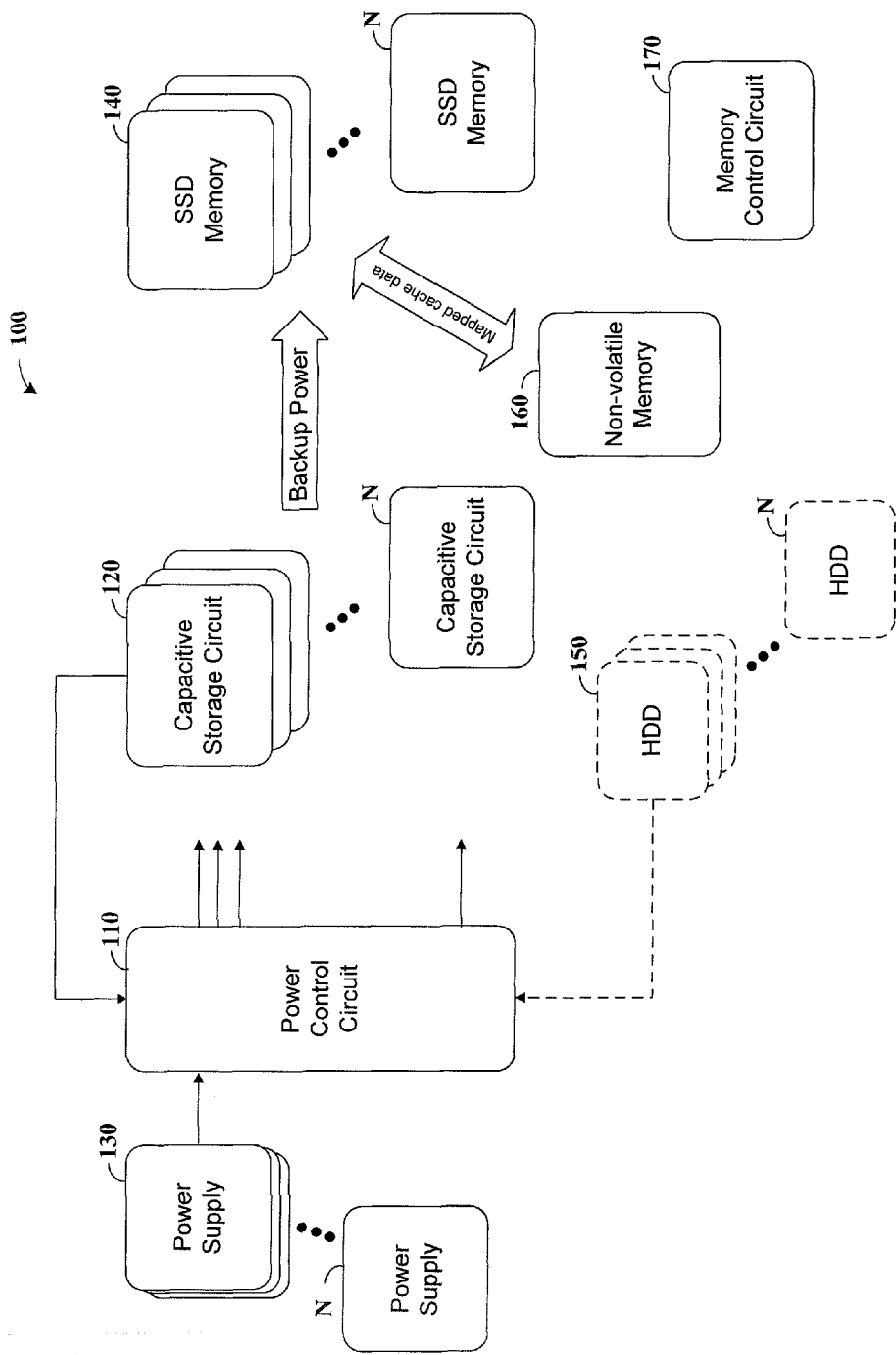
FIG. 1 shows a system for operating backup functions of a data storage circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention are believed to be useful for monitoring of capacitive elements in data storage devices, circuits and systems. A particular application of the present invention relates to solid state devices (SSDs) that provide nonvolatile memory storage functions. While the present invention is not necessarily limited to such applications, various aspects of the invention may be appreciated through a discussion of various examples using this context.

According to an example embodiment of the present invention, power supplied to a capacitive circuit in a startup condition is controlled in response to power usage by other circuits, to limit the power draw upon a power supply that provides power to the circuits. In some instances, this control is effected by delaying or limiting the current draw by the capacitive circuit. Certain implementations involve the use of real-time and/or predictive feedback in controlling supplied power and, where appropriate, startup and other functions of the capacitive circuit. Other implementations involve a hybrid startup approach involving the initial powering of solid state memory and hard disk drive (HDD) memory, respectively using a capacitive-type backup power circuit and a spindle motor, via controllable power-on for the respective backup power circuit and spindle motor. Using these approaches, current draw upon the power supply is limited to a threshold-type level that is appropriate for the power supply being used.

According to another example embodiment of the present invention, a solid-state data storage device stores data in response to data accesses under the control of a memory control circuit, and is controlled to exhibit desirable power-on characteristics. The data storage device includes a power supply, a primary memory circuit, a caching memory circuit and a backup power circuit structure. The primary memory circuit stores data and maintains integrity of the data in the absence of primary operating power. The caching memory circuit is mapped to the primary memory circuit and to provide the memory control circuit with access to a set of data representing a cached portion of memory that is mapped to the primary memory circuit. The backup power circuit structure includes a backup power-reservoir circuit and a control circuit. The backup power-reservoir circuit includes a capacitor and that is configured to hold a charge to power backup functions of the caching memory circuits in response to a power interruption. The control circuit controls the charging of the backup power-reservoir circuit, via the power supply, in response to the charging of at least another capacitor-based circuit via the power supply.

The control circuit limits the combined current load upon the power supply below a threshold current load using one or more approaches, in connection with various example embodiments. In some embodiments, the control circuit delays the charging of the backup power-reservoir circuit in response to another memory circuit drawing power, such as another capacitor-based circuit being charged by the power supply or an HDD motor spinning up at start up. In other embodiments, the control circuit dynamically controls the powering of two or more circuits upon startup, based upon one or more of current draw, predictive or known power needs, real-time feedback, or priority-based power assignment to circuits being powered. For certain applications, the control circuit used HDD-based controls for delaying motor startup to also delay startup of SDD type memory circuits and/or related items, such as a storage capacitor.

In connection with various example embodiments, the loss of primary power is detected using a controller, that in turn operates a capacitive-type circuit as described herein to control backup functions. The contents of volatile-type memory circuits are then transferred to nonvolatile memory circuits. For further details regarding such approaches as may be implemented in connection with one or more example embodiments, reference can be made to U.S. Pat. No. 7,269,755 to Moshayedi et al., which is fully incorporated herein by reference.

The following discussion of the Figures and the embodiments shown therein represent exemplary implementations of various embodiments, which may be implemented in connection with one or more approaches as described above, in connection with other figures and/or in the claims section that follows. Many different combinations of memory circuits, power supplies, control circuits and other device/system circuits may be used in accordance with various aspects of the present invention, and may involve one or more of the systems and/or approaches as shown in the figures. In addition, various discussion refers to "memory" and/or "data storage," where one or both terms may refer to similar or the same types of devices and systems, as well understood in the relevant art.

FIG. 1 shows a system 100 for operating backup functions of a data storage circuit, according to an example embodiment of the present invention. The system 100 includes a power control circuit 110 that is configured to control the powering of memory circuits including one or more capacitive storage circuits 120-N, which respectively store and provide backup power to SSD memory circuits 140-N, and to HDD memory circuits 150-N, using power from one or more power supplies 130-N. The power control circuit 110 controls the powering of the capacitive storage circuits 120-N (and the HDD memory circuits 150-N, if present) upon startup to limit current draw upon the one or more power supplies 130-N, such as by staggering the start of each capacitive storage circuit (or HDD) relative to the starting of other circuits. Each of the SSD memory circuits 140-N is respectively mapped to a non-volatile type memory circuit 160 (which may include one or more memory circuits), which maintains data integrity in the absence of operating power. A memory control circuit 170 controls access to the respective SSD memory circuits 140-N and the non-volatile type memory circuit 160. Generally, the SSD and non-volatile type memory circuits 140 and 160 store data in response to data accesses controlled by the memory control circuit 170, with the SSD memory circuits providing the memory control circuit with access to a set of data representing a cached portion of memory that is mapped to the non-volatile type memory circuit.

Using capacitive storage circuit 120, power supply 130 and memory 140 as an example, the capacitive storage circuit stores energy provided by the power supply, as controlled by the power control circuit 110, for powering backup functions of the SSD memory circuit 140. For example, upon startup of the system 100, the power control circuit 110 charges the capacitive storage circuit 120 to a level that is generally sufficient to provide enough charge to power backup functions of the memory 140. Where another one of the capacitive storage circuits 120-N and/or one of the HDD memory circuits 150-N is also present, the power control circuit 110 charges the capacitive storage circuit 120 relative to the other circuits in a manner that limits the current draw upon the power supply 130. Depending upon the number and type of circuits to be powered, and as appropriate, upon programming or other startup algorithm type approaches, the powering of each circuit is staggered, overlapped or concurrent, to meet limits for the power supply 120 and further according to needs of the system 100. In these contexts, the limits upon the power supply may correspond, for example, to a threshold operating level of the power supply 120, which may relate to a threshold voltage or other type of threshold limit. Using known or otherwise detected power requirements for each type of circuit to be powered, the power control circuit 110 can selectively control the powering of each circuit by staggering, limiting or other approaches as discussed herein.

As relative to the above algorithm-based embodiment, in connection with these and other embodiments, the power supply control circuit 110 is configured to store power startup algorithms including respective startup algorithms for starting the capacitive storage circuit 120 and at least one other circuit, and for starting both the capacitive storage circuit and at least one different memory circuit (e.g., HDD 150). The power supply control circuit 110 selects one of the stored startup algorithms based upon the type of memory circuits in the system 100, and controls the charging of the capacitive storage circuit and other circuit(s) by executing the selected startup algorithm.

In response to a power outage, the capacitive storage circuit 120 powers at least the SSD memory circuit 140 to perform backup functions, such as to write cached data to the non-volatile type memory circuit 160, and/or to perform security functions such as to delete data in the cache. The backup functions are carried out by a controller circuit within and/or connected to the SSD memory circuit 140. In some embodiments, the capacitive storage circuit 120 also powers other functions, such as by powering the non-volatile type memory circuit 160 for writing cached data from the SSD memory circuit 140.

Figure 2:
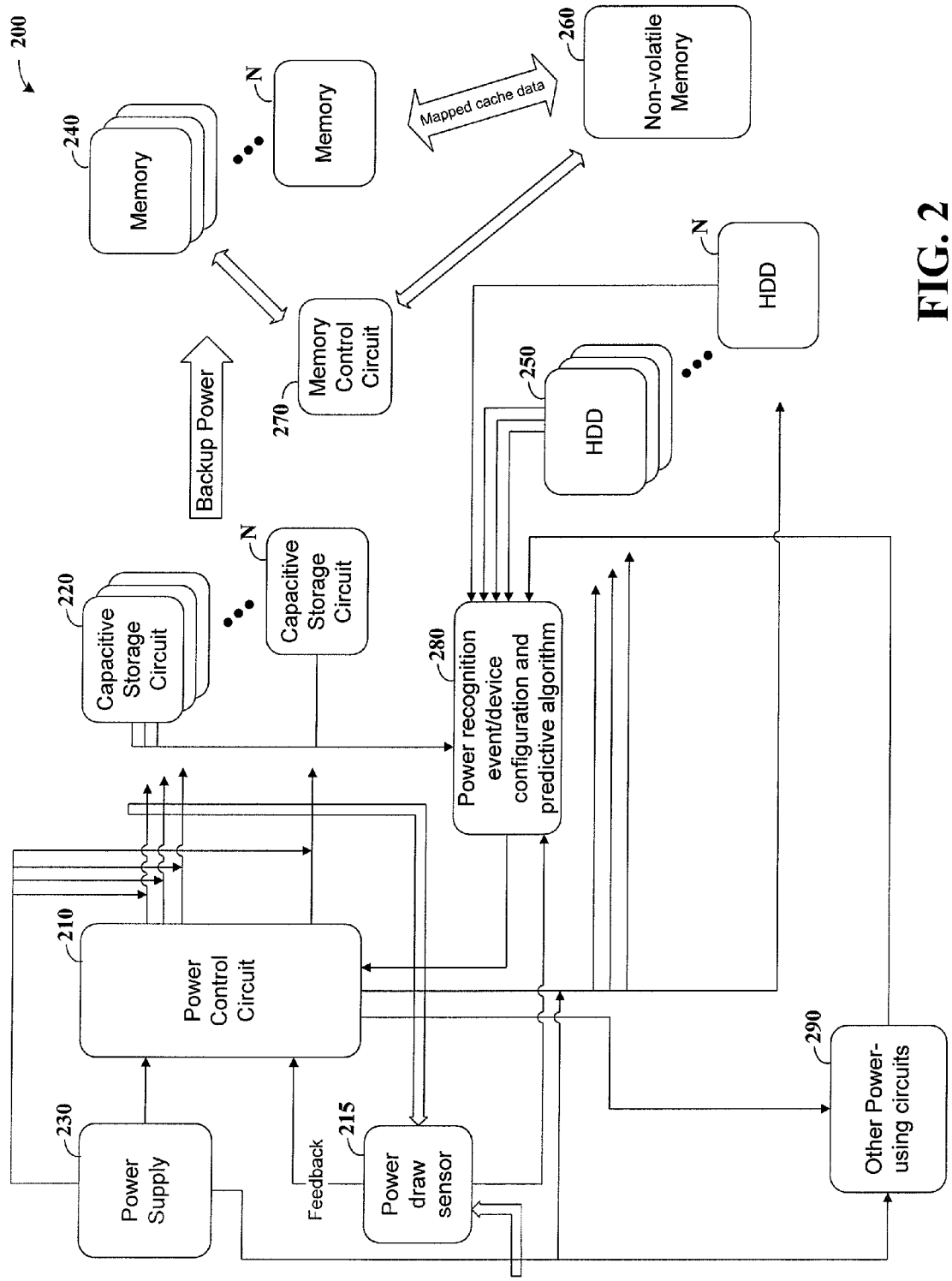
FIG. 2 shows a system for operating backup functions of a data storage circuit, according to an example embodiment of the present invention.

In some embodiments, the power control circuit 110 is a stand-alone circuit that may be implemented completely separate from memory circuits as shown in FIG. 1 or from other system circuits drawing power from the power supplies 130-N. In other embodiments, the power control circuit 110 is integrated or otherwise implemented with other circuits, such as some or all of the memory circuits shown in FIG. 1. For example, certain embodiments are directed to the power control circuit 110 alone, other embodiments are directed to the power control circuit 110 implemented with capacitive storage circuits 120-N, and still other embodiments are directed to the power control circuit 110 implemented with the capacitive storage circuits and SSD memory circuits 140-N. These exemplary combinations are applicable for implementation as shown in FIG. 1 and as shown in FIG. 2 as well, with the power control circuit 210 discussed below selectively implemented as part of or otherwise with other system components.

In connection with FIG. 1 and as may otherwise be implemented in connection with various embodiments, the power supplies 130-N may represent different power sources and/or different power circuits drawing from one or more common sources. For instance, a system may use a single power source with different power supply circuits that respectively regulate to power to different voltages (e.g., 12V and 5V) on different power rails. In such an instance, the power control circuit 110 may control and/or draw power from both power rails, each effectively acting as its own power supply.

Another implementation involves using power from an HDD spindle that spins magnetic recordable media for one of the HDD memory circuits 150-N. For instance, where HDD memory circuit 150 is part of the system 100, the power control circuit 110 can anticipate the use of power available from the spindle as it continues to spin after a power interruption to power backup functions of an SDD memory circuit 140. In consideration of available HDD spindle power, the power control circuit 110 can control the startup of various circuits including the capacitive storage circuits 120-N in a manner that provides desired backup power as combined with the total available backup power including that from the HDD spindle.

The power control circuit 110 controls the powering of various circuits using different circuitry and/or control approaches, in connection with various example embodiments. In one embodiment, the power control circuit 110 includes a transistor configured to slow the charging of one of the capacitive storage circuits 120-N to limit the current load upon the power supply 120 to a level that is below a threshold current. In one implementation, the power control circuit 110 further includes a resistor-capacitor (RC) circuit that controls turn-on of the transistor for slowing the charging of the capacitive storage circuit. In another implementation, the power control circuit 110 includes a pulse width modulation (PWM) circuit that controls turn-on of the transistor for slowing the charging of the capacitive storage circuit. In still another implementation, the power control circuit 110 includes a variable voltage controller that provides a variable voltage signal to control the turn-on of the transistor for slowing the charging of the capacitive storage circuit.

FIG. 2 shows a system 200 for operating backup functions of a data storage circuit, according to another example embodiment of the present invention. As the system 200 includes several components that are similar to those shown in FIG. 1, the following discussion avoids repeating certain aspects of that discussion for brevity. The system 200 includes a power control circuit 210 that controls the startup power supplied to capacitive storage circuits 220-N, which stores energy from a power supply 230 and provides stored energy to (volatile-type) SSD memory circuits 240-N under power loss conditions. The power control circuit 210 controls the initial charging of the capacitive storage circuits 220-N upon startup of the system 200, as well as the startup of HDD spindle motors for HDD memory circuits 250-N, to limit the current/power draw upon the power supply 230 relative, for example, to a threshold limit defined for the power supply.

As with the above discussion of the system 100 in FIG. 1, the system 200 is applicable for use with a non-volatile memory 260 to which the SSD memory 240 is mapped, and a memory control circuit 270 for controlling memory operations of the SSD memory 240 and non-volatile memory 260, which may include backup functions powered by the capacitive storage circuit 220. These non-volatile and memory control circuits 260 and 270 may be included with the system 200 and/or as part of the SSD memory 240 (or 240-N), in accordance with various embodiments.

The power control circuit 210 limits power drawn from the power supply 230 using one or more of a variety of control approaches. Some power control approaches are similar to those discussed above with FIG. 1. In certain embodiments, the system 200 includes a power draw sensor 215 that senses power drawn from the power supply 230, across circuits including the one or more capacitive storage circuits 220-N, one or more HDDs 250-N, and other power-using circuits 290 in the system. The power control circuit 210 uses a signal from the power draw sensor 215 (which may be included as part of the power control circuit 210) to determine power needs of the system 200, from the power supply 230. Using these determined power needs, the power control circuit 210 controls the supply of power and/or the respective startup operation of one or more circuits in the system 200 to limit the power drawn from the power supply 230.

In some implementations, the power control circuit 210 determines an available current load by subtracting an amount of current being drawn from the power supply 230 from a threshold current load, charging the capacitive storage circuit 220 in response to the available current load being sufficient to supply an initial current load required for powering the capacitive storage circuit, and delaying the charging of the capacitive storage circuit in response to the available current load being insufficient to supply an initial current load required for powering the power-reservoir circuit. After the delay, the power control circuit 210 controls the charging of the capacitive storage circuit in response to the available current load increasing to a level that is sufficient to supply an initial current load required for powering the capacitive storage circuit.

In other embodiments, the system 200 includes a power recognition circuit 280 that recognizes, detects and/or predicts conditions relative to power events such as startup events or those involving a change in power draw, as well as circuit configurations as may be relative, for example, to detecting a number and type of circuits drawing power from the power supply and their respective power needs. In some implementations, the power recognition circuit 280 is included with the power control circuit 210, and may also be implemented with the power draw sensor 215 as discussed above.

In some embodiments, the power recognition circuit 280 detects the number and type of memory circuits, including the number and type of capacitive storage circuits 220-N and of HDD circuits 250-N and uses this information for providing an input to the power control circuit 210 (or provides the information as a direct input), which in turn uses the information to stagger, limit or otherwise control the startup of the different memory circuits. In some implementations, the power recognition circuit 280 further identifies or assigns a priority to each of the respective memory circuits, which is used by the power control circuit 210 to prioritize startup of these circuits. In some implementations, each of the capacitive storage circuits 220-N sends an identification signal to the power recognition circuit 280 to identify itself and/or communicate information that can be used to determine power requirements of the circuit sending the identification signal. Similar approaches may be used to control the startup of other circuits in the system 200.

In accordance with various embodiments, the power recognition circuit 280 detects power events or other conditions for circuits drawing power from the power supply 230, and uses those detected events/conditions in providing input to the power control circuit 210 in different manners. In one implementation, the power recognition circuit 280 monitors functions of circuits drawing power from the power supply 230, and based upon a known or otherwise ascertained function that requires a particular power draw, communicates with the power control circuit 210 to facilitate that power draw. For instance, the power recognition circuit 280 may monitor the progress of the startup of one of capacitive storage circuit 220, and in response to an event corresponding to the circuit reaching a certain level of charge, may instruct the power control circuit 210 to initiate the charging of another one of the capacitive storage circuits 220. This approach may involve, for example, controlling the startup (or other powering) of one or more capacitive storage circuits 220 based upon a voltage comparison or mismatch between the power supply 230 and one or more capacitive storage circuits.

In other implementations, the power recognition circuit 280 monitors other operational characteristics, such as those relating to an expected increase in use of the SSD memory 240 (e.g., as a cache), and correspondingly control the startup of one or more of the capacitive storage circuits 220-N to ensure that sufficient backup power is present to maintain backup functions in the event of a power loss. These characteristics may correspond to startup conditions of the system 200 and/or to other conditions that may or may not affect the startup of the system, such as those involving bringing another one of the capacitive storage circuits 220-N online to support detected or predicted increases in cached data.

Other implementations involve controlling startup in response to a power failure event, with the power recognition circuit 280 detecting the failure event and, in response to the event, controlling the startup of one or more of the capacitive storage circuits 220 to account for power draw due to the failure. For instance, where a bank of capacitive storage circuits 220-N are used to power a set number of SSD memory circuits 240-N, and where the memory circuits are respectively powered by different power supplies, the bank of capacitive storage circuits can be operated at a total charge level that is less than that required due to failure of all power supplies, based upon a probability (computed or otherwise) that more than one power supply might concurrently fail. In these contexts, the power recognition circuit 280 responds to a power failure of a particular supply and any related shutdown or increased needs via power rerouting by assessing controlling (or providing control for) the powering of circuits in the system 200.

In other embodiments, the power recognition circuit 280 predicts future power requirements based upon one or more of known expected operating conditions, learned conditions based upon historical data or real-time operating conditions, for one or more circuits powered by the power supply 220. The power recognition circuit 280 generates a predictive power requirement signal indicative of predicted power requirements and provides that signal to the power control circuit 210 for operating the system 200. The power control circuit 210 uses power requirement signal to dynamically control the offset charging of at least one of the capacitive storage circuits 220-N, to limit the current load upon the power supply 220 according to a threshold current. In certain implementations, the power recognition circuit 280 works with the power draw sensor 215 to monitor power draw and predict future power draw, which may further involve storing information characterizing historical power requirements for different circuits.

The power control circuit 210 controls power supplied to the respective circuits in one or more of a variety of manners. In some applications, the power control circuit directly controls the power supplied to each of the respective circuits by limiting power provided by the power supply 230, such as by directly supplying power to the respective circuits in a controllable manner. In other applications, the power control circuit controls power supplied to each of the respective circuits by communicating with the respective circuits to control the startup of the circuits, which may involve indirectly controlling power supplied form the power supply 230 to each circuit. For instance, the power control circuit 210 may send a signal to the capacitive storage circuit 230 to initiate a startup cycle, in response to which signal the capacitive storage circuit 230 starts up and draws power from the power supply 230.

In these contexts, FIG. 2 shows the system 200 as operable with the power supply 230 coupled through the power control circuit 210, with the power control circuit 210 passing power directly to the respective circuits. FIG. 2 thus also shows that power supply 230 may be coupled directly to the circuits it powers (e.g., via a power rail), including the shown connections to capacitive storage circuits 220-N, HDDs 250-N and other power using circuits 290. While not shown, one or both of the power control circuit 210 and the power supply 230 may also be coupled to memory circuits 240-N, non-volatile memory 260 and memory control circuit 270, depending upon the implementation, with respective power supply lines omitted for clarity in the figure.

Figure 3:
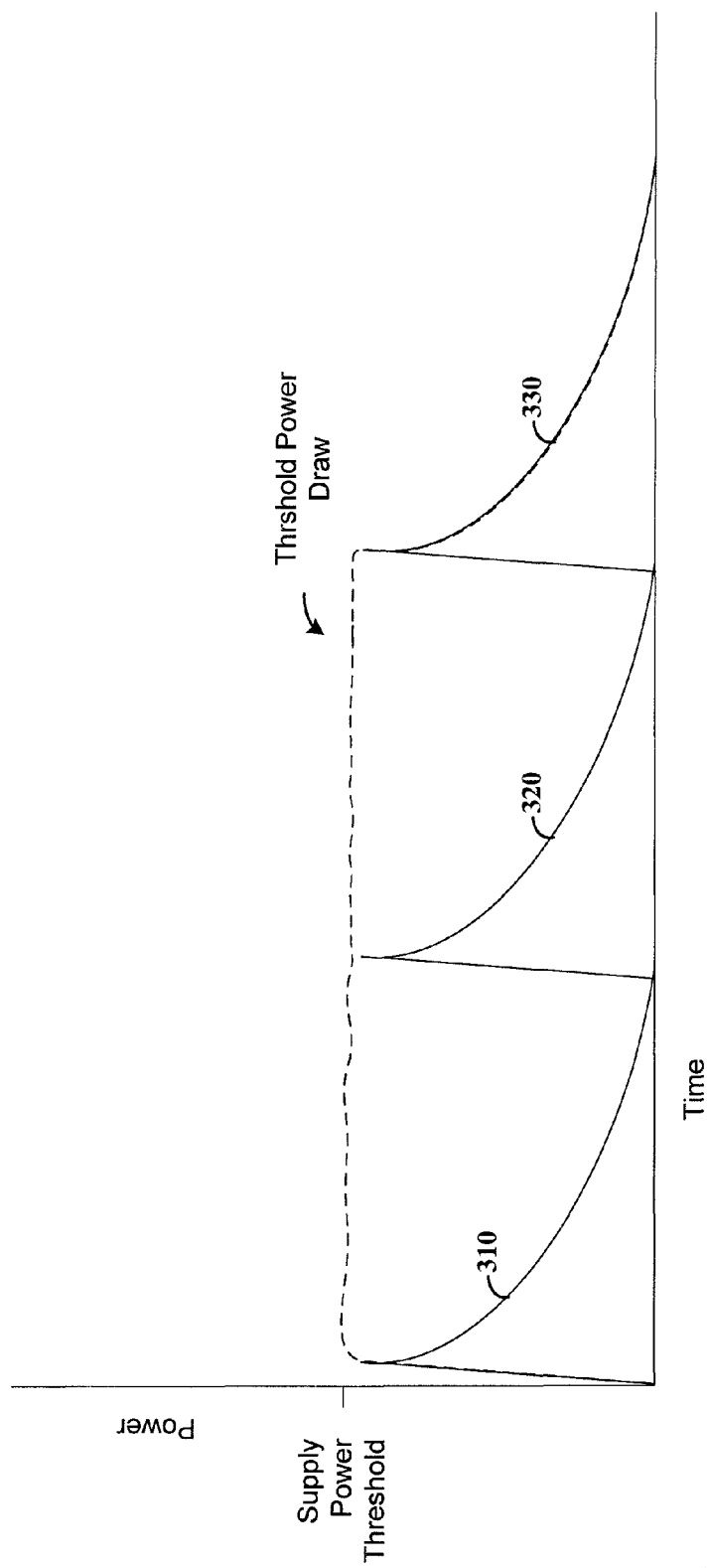
FIG. 3 shows a plot for charging capacitive circuits to store energy for powering backup functions of a data storage circuit, according to another example embodiment of the present invention.
Figure 4:
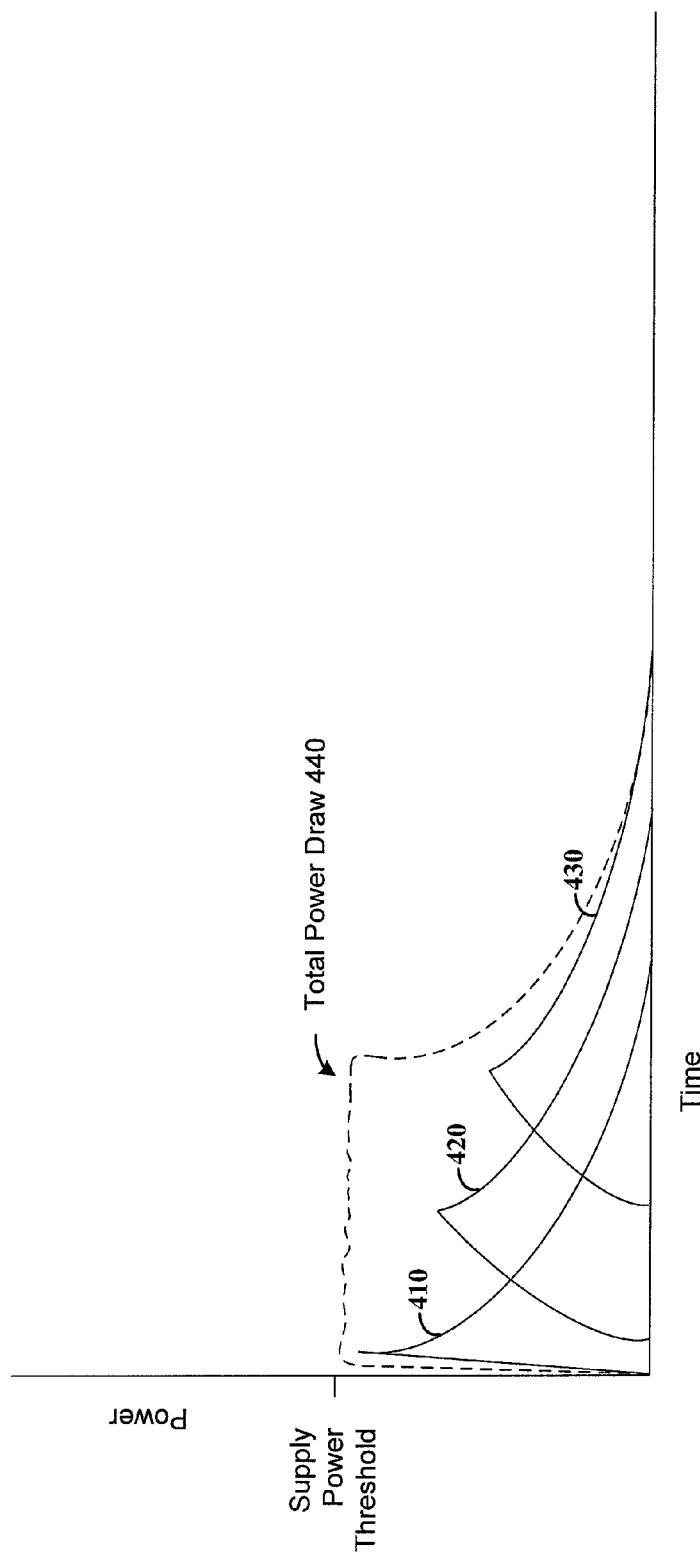
FIG. 4 shows a plot for charging capacitive circuits under controlled power draw to store energy for powering backup functions of a data storage circuit, according to another example embodiment of the present invention.

FIGS. 3-4 show various plots for controlling power supplied to data storage circuits, as may be implemented with various embodiments including, for example, those shown in FIG. 1, FIG. 2 and described above. Beginning with FIG. 3, supply power versus time is shown for the staged powering of three capacitive circuits that store energy for operating backup functions, with the capacitive circuits' respective power draw being shown at plot portions 310, 320 and 330. The startup of the respective capacitive circuits is delayed so that each circuit starts sequentially, with power drawn from the power supply being limited to a supply power threshold as shown. In these contexts, the power drawn by each capacitive circuit is less than the threshold, and by staggering the start of each capacitive circuit, the total power draw is maintained below the threshold.

FIG. 4 shows a plot for charging three capacitive circuits under controlled power draw to store energy for powering backup functions of a data storage circuit, according to another example embodiment of the present invention. In FIG. 4, the respective power draw of three capacitive circuits is shown as plot portions 410, 420 and 430, with the powering of respective capacitive circuits overlapping. The total power drawn at any given time is limited to the supply power threshold. From a graphical perspective, when added together for any given moment in time, the power drawn as shown in each of the respective curves 410, 420 and 430 is no more than the supply power threshold. Accordingly, the area under dashed plot 440 generally corresponds to the combined areas under plots 410, 420 and 430 (i.e., relative to the integral). In some implementations, an algorithm is executed with variable inputs respectively pertaining to power draw characteristics of each of the capacitive circuits, and used to generate control signals to power the respective circuits as shown.

Similar approaches to those shown in FIGS. 3 and 4 can be implemented to control the startup or other operation of other circuits, such as HDD memory circuits, in connection with capacitive storage circuits as described herein.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include combining various sensing, prediction and monitoring circuits, powering different types of circuits, powering directly with indirect control, powering indirectly with direct control, and others as relevant to the operation of data storage circuits and of capacitive storage circuits used for operating backup functions of data storage circuits. Such modifications and changes do not depart from the true spirit and scope of the present invention, which is set forth in the following claims.

What is claimed is:

1. A data storage device that stores data in response to data accesses under the control of a memory control circuit, the data storage device comprising:
   a primary memory circuit configured and arranged to maintain data integrity in the absence of operating power;
   a solid-state caching memory circuit mapped to the primary memory circuit and configured and arranged to provide the memory control circuit with access to a set of data representing a cached portion of memory that is mapped to the primary memory circuit, the caching memory circuit including a controller configured to control backup functions of the caching memory circuit in response to a power interruption;
   a backup power-reservoir circuit that includes a capacitor coupled to receive a charge from a power supply, and that is configured to hold a charge to supply backup power for powering backup functions of the caching memory circuit; and
   a power supply control circuit configured and arranged to control, in response to a determined type and number of memory circuits in the data storage device, offset charging of the backup power-reservoir circuit relative to powering of another memory circuit to limit a current load upon the power supply according to a threshold current.

2. The device of claim 1, wherein the power supply control circuit is configured and arranged to determine power requirements for startup for each memory circuit based upon the determined type of each memory circuit.

3. The device of claim 1, further including
a hard disk drive memory circuit including a spindle that spins magnetic recordable media, and
a backup power control circuit configured to control the supply of power to the primary memory circuit and the solid-state caching memory circuit to carry out backup functions using power from the backup power-reservoir circuit and using power generated from the spinning recordable media after power loss.

4. The device of claim 1, wherein
the solid-state caching memory circuit is configured to send an identification signal to the control circuit to inform the memory control circuit of power requirements of the solid-state caching memory circuit, and
the power supply control circuit is configured to determine the type and number of memory circuits in the data storage device using the identification signal.

5. The device of claim 1, wherein the power supply control circuit is configured and arranged to
determine the number and type of memory circuits, including the solid-state caching memory circuit, that are present in the data storage device, and
control the charging of the backup power-reservoir circuit via the power supply, relative to powering at least another memory circuit in the data storage device via the power supply, to limit the current load upon the power supply based on a threshold current.

6. The device of claim 1, wherein the power supply control circuit is configured and arranged to
store power startup algorithms including respective startup algorithms for starting the backup power-reservoir circuit, at least one different memory circuit, and for starting both the backup power-reservoir circuit and at least one different memory circuit,
select one of the stored power startup algorithms based upon the type of memory circuits in the data storage device, and
control the charging of the backup power-reservoir circuit by executing the selected power startup algorithm.

7. The device of claim 1,
further including a current sensor circuit configured and arranged to detect current used by system circuits that draw current from the power supply and to generate a current draw signal that characterizes the detected current for each system circuit,
wherein the power supply control circuit is configured to use the generated current draw signal to dynamically control the offset charging of at least the backup power-reservoir circuit and limit the current load upon the power supply according to the threshold current.

8. The device of claim 1, wherein the power supply control circuit is configured to control the charging of the backup power-reservoir circuit by
determining an available current load by subtracting an amount of current being drawn from the power supply from the threshold current,
charging the backup power-reservoir circuit in response to the available current load being sufficient to supply an initial current load required for powering the power-reservoir circuit, and delaying the charging of the backup power-reservoir circuit in response to the available current load being insufficient to supply an initial current load required for powering the power-reservoir circuit, and after the delay, charging the backup power-reservoir circuit in response to the available current load increasing to a level that is sufficient to supply an initial current load required for powering the power-reservoir circuit.

9. The device of claim 1,
further including a predictive power usage circuit configured and arranged to predict power requirements for system circuits that draw power from the power supply using detected operational characteristics of the system circuits, and to generate a predictive power requirement signal indicative of predicted power requirements, and
wherein the power supply control circuit is configured to use the generated power requirement signal to dynamically control the offset charging of at least the backup power-reservoir circuit and limit the current load upon the power supply according to the threshold current.

10. The device of claim 1,
further including a current sensor circuit configured and arranged to detect current used by system circuits that draw current from the power supply and to generate a current draw signal that characterizes the detected current for each system circuit,
further including a predictive power usage circuit configured and arranged to
detect operational characteristics of the system circuits,
receive and store current usage data for each of the system circuits based upon the generated current draw signal,
predict power requirements for said circuits using the detected operational characteristics and stored current usage data, and
generate a predictive power requirement signal indicative of predicted power requirements, and
wherein the power supply control circuit is configured to use the generated predictive power requirement signal to dynamically control the offset charging of at least the backup power-reservoir circuit and limit the current load upon the power supply according to the threshold current.

11. The device of claim 1, wherein the power supply control circuit is configured to control the charging of the backup power-reservoir circuit by delaying the charging of the backup power-reservoir circuit in response to another circuit drawing power from the power supply.

12. The device of claim 11, wherein the other circuit is another power-reservoir circuit and wherein the power supply control circuit is configured to control the charging of the respective power-reservoir circuits by limiting the charging of one of the power-reservoir circuits relative to the charging of the other one of the power-reservoir circuits.

13. The device of claim 1, wherein the power supply control circuit is configured to control the charging of the backup power-reservoir circuit by delaying the charging the backup power-reservoir circuit during an initial startup period of the device.

14. The device of claim 1, wherein the power supply control circuit is configured to assign a startup priority rank to each memory circuit including the backup power-reservoir circuit and to power the memory circuits upon startup based upon the priority rank.

15. The device of claim 1, wherein the power supply control circuit is configured to control the charging of the backup power-reservoir circuit by controlling the voltage of the power supply at a level that limits the current load upon the power supply to a level that is below the threshold current.

16. The device of claim 1, wherein the power supply control circuit includes a transistor configured to slow the charging of the backup power-reservoir circuit to limit the current load upon the power supply to a level that is below the threshold current.

17. The device of claim 1, wherein the power supply control circuit includes
   a transistor configured to slow the charging of the backup power-reservoir circuit to limit the current load upon the power supply to a level that is below the threshold current, and
   a resistor-capacitor (RC) circuit configured to control turn-on of the transistor for slowing the charging of the backup power-reservoir circuit.

18. The device of claim 1, wherein the power supply control circuit includes
   a transistor configured to slow the charging of the backup power-reservoir circuit to limit the current load upon the power supply to a level that is below the threshold current, and
   a pulse width modulation (PWM) circuit configured to control turn-on of the transistor for slowing the charging of the backup power-reservoir circuit.

19. The device of claim 1, wherein the power supply control circuit includes
   a transistor configured to slow the charging of the backup power-reservoir circuit to limit the current load upon the power supply to a level that is below the threshold current, and
   a variable voltage controller configured to provide a variable voltage signal to control turn-on of the transistor for slowing the charging of the backup power-reservoir circuit.

20. A data storage device that stores data in response to data accesses under the control of a memory control circuit, the data storage device comprising:
   a power supply;
   a primary memory circuit configured and arranged to maintain data integrity in the absence of operating power;
   a solid-state caching memory circuit mapped to the primary memory circuit and configured and arranged to provide the memory control circuit with access to a set of data representing a cached portion of memory that is mapped to the primary memory circuit, the caching memory circuit including a controller configured to control backup functions of the caching memory circuit in response to a power interruption;
   a backup power-reservoir circuit that includes a capacitor coupled to receive a charge from the power supply, and that is configured to hold a charge to supply backup power for powering backup functions of the caching memory circuit; and
   a power supply control circuit configured and arranged to
      in response to a number and type of memory circuits in the data storage device, select a power startup algorithm from a set algorithms respectively for starting a combination of memory circuits including the backup power-reservoir circuit and at least another memory circuit, at least one of the algorithms for starting up a memory circuit of a different type than the backup power-reservoir circuit, and
      execute the selected algorithm to control offset charging of the backup power-reservoir circuit relative to powering of another memory circuit to limit a current load upon the power supply according to a threshold current.

21. A method of controlling a data storage device that stores data in response to data accesses under the control of a memory control circuit, the data storage device including power supply, a primary memory circuit that maintains data integrity in the absence of operating power, a solid-state caching memory circuit that is mapped to the primary memory circuit and provides the memory control circuit with access to a set of data representing a cached portion of memory that is mapped to the primary memory circuit, a controller configured to control backup functions of the caching memory circuit in response to a power interruption, and a backup power-reservoir circuit that includes a capacitor coupled to receive a charge from the power supply, and that holds a charge to supply backup power for powering backup functions of the caching memory circuit, the method comprising:
   controlling, in response to a determined type and number of memory circuits in the data storage device, offset charging of the backup power-reservoir circuit relative to powering of another memory circuit to limit a current load upon the power supply according to a threshold current.

22. A method of controlling a memory device that stores data in response to data accesses under the control of a memory control circuit, the memory device including a power supply, a primary memory circuit that maintains data integrity in the absence of operating power, a solid-state caching memory circuit that is mapped to the primary memory circuit and provides the memory control circuit with access to a set of data representing a cached portion of memory that is mapped to the primary memory circuit, and a backup power-reservoir circuit that includes a capacitor coupled to receive a charge from the power supply, and that holds a charge to supply backup power for powering backup functions of the caching memory circuit, the method comprising:
   in response to a number and type of memory circuits in the memory device, selecting a power startup algorithm from a set algorithms respectively for starting a combination of memory circuits including the backup power-reservoir circuit and at least another memory circuit, at least one of the algorithms for starting up a memory circuit of a different type than the backup power-reservoir circuit, and
   executing the selected algorithm to control offset charging of the backup power-reservoir circuit relative to powering of another memory circuit to limit a current load upon the power supply according to a threshold current.

* * * * *